(12) United States Patent
Laven et al.

(10) Patent No.: US 10,615,039 B2
(45) Date of Patent: Apr. 7, 2020

(54) SEMICONDUCTOR DEVICE HAVING A DEVICE DOPING REGION OF AN ELECTRICAL DEVICE ARRANGEMENT

(71) Applicant: Infineon Technologies AG, Neubiberg (DE)

(72) Inventors: Johannes Georg Laven, Taufkirchen (DE); Hans-Joachim Schulze, Taufkirchen (DE); Werner Schustereder, Villach (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/961,525

(22) Filed: Apr. 24, 2018

(65) Prior Publication Data

US 2018/0240672 A1    Aug. 23, 2018

Related U.S. Application Data

(62) Division of application No. 15/297,914, filed on Oct. 19, 2016, now Pat. No. 9,960,044.

(30) Foreign Application Priority Data

Oct. 20, 2015 (DE) ........................ 10 2015 117 821

(51) Int. Cl.
*H01L 21/265* (2006.01)
*H01L 29/06* (2006.01)
(Continued)

(52) U.S. Cl.
CPC .. *H01L 21/26586* (2013.01); *H01L 21/26513* (2013.01); *H01L 21/26593* (2013.01);
(Continued)

(58) Field of Classification Search
CPC ......... H01L 21/02227; H01L 21/02365; H01L 21/02518; H01L 21/70; H01L 21/702; H01L 21/71; H01L 21/8232
See application file for complete search history.

(56) References Cited

U.S. PATENT DOCUMENTS 4,906,585 A    3/1990 Neppl et al.
5,374,564 A    12/1994 Bruel
(Continued)

FOREIGN PATENT DOCUMENTS

CN    103000672 A    3/2013
CN    103972281 A    8/2014
DE    102014117538 A1    6/2016

OTHER PUBLICATIONS

Johnson, B.C. et al., "Ion-channeling and Raman scattering study of damage accumulation in silicon", Journal of Applied Physics, vol. 95, No. 3, Feb. 1, 2004, pp. 1096-1101.

Pelaz, Lourdes et al., "Ion-beam-induced amorphization arid recrystallization in silicon", Journal of Applied Physics, vol. 96, No. 11, Dec. 1, 2004, pp. 1-34.

(Continued)

*Primary Examiner* — Cheung Lee
(74) *Attorney, Agent, or Firm* — Murphy, Bilak & Homiller, PLLC

(57) ABSTRACT

A semiconductor device includes a device doping region of an electrical device arrangement disposed in a semiconductor substrate. A portion of the device doping region has a vertical dimension of more than 500 nm and a doping concentration of greater than $1*10^{15}$ dopant atoms per $cm^3$. The doping concentration of the portion of the device doping region varies by less than 20% from a maximum doping concentration in the device doping region.

19 Claims, 7 Drawing Sheets

(51) Int. Cl.
  *H01L 29/08*  (2006.01)
  *H01L 29/10*  (2006.01)
  *H01L 29/36*  (2006.01)
  *H01L 29/66*  (2006.01)
  *H01L 29/78*  (2006.01)
  *H01L 29/861*  (2006.01)
(52) U.S. Cl.
  CPC ...... *H01L 29/0634* (2013.01); *H01L 29/0638* (2013.01); *H01L 29/0834* (2013.01); *H01L 29/1095* (2013.01); *H01L 29/36* (2013.01); *H01L 29/6609* (2013.01); *H01L 29/66712* (2013.01); *H01L 29/7802* (2013.01); *H01L 29/8613* (2013.01); *H01L 29/861* (2013.01)

(56) References Cited

U.S. PATENT DOCUMENTS

| | | | |
|---|---|---|---|
| 8,710,620 | B2 | 4/2014 | Schulze et al. |
| 2009/0311839 | A1 | 12/2009 | Miyahara et al. |
| 2014/0021590 | A1* | 1/2014 | Schulze .............. H01L 29/0619 257/655 |
| 2015/0084120 | A1 | 3/2015 | Weber et al. |
| 2016/0172438 | A1 | 6/2016 | Jelinek et al. |

OTHER PUBLICATIONS

Raineri, V. et al,, "High-energy channeling implants of phosphorus along the silicon [100] and [110] axes", Physical Review 8, vol. 44, No. 19, Nov. 15, 1991, pp. 10 568-10 577.

* cited by examiner

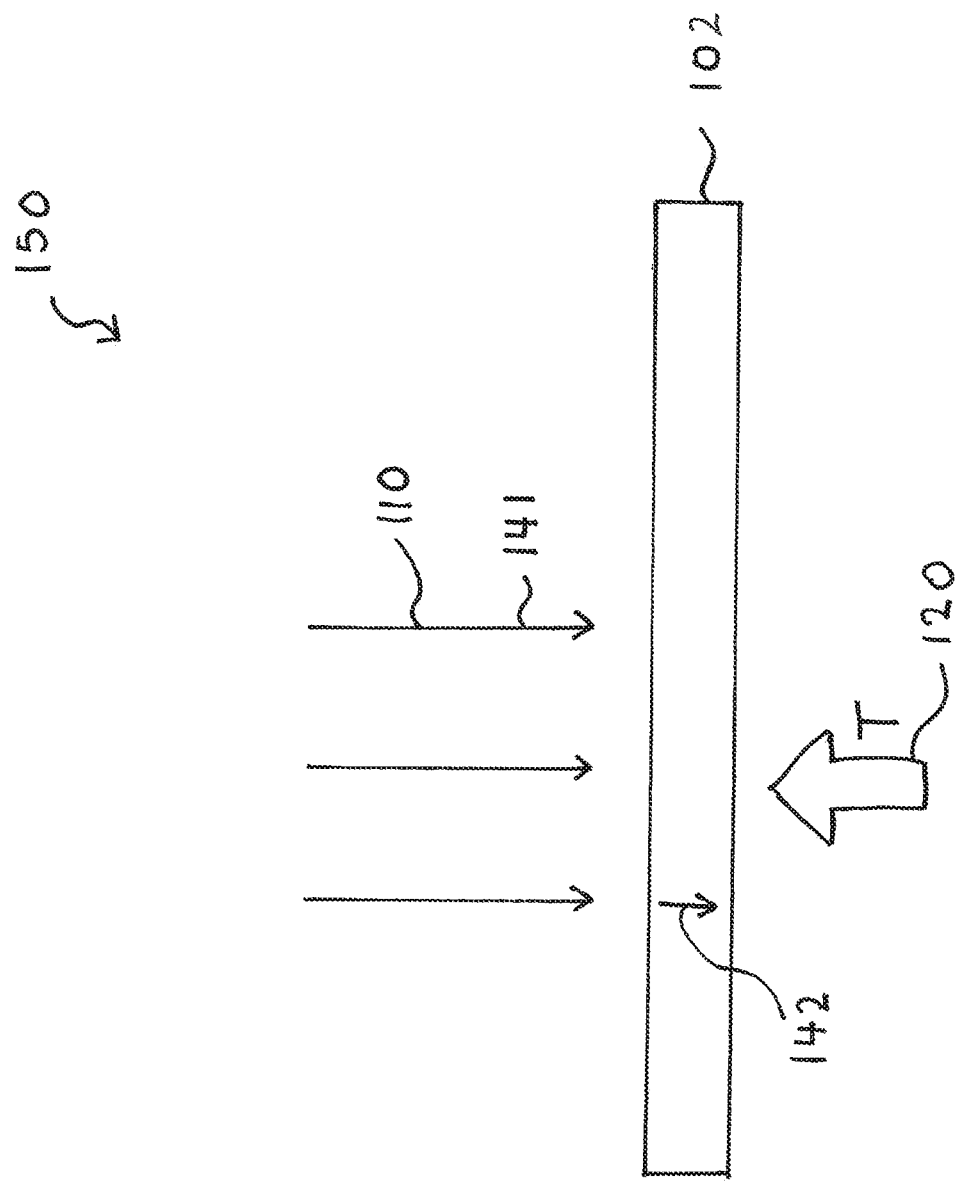

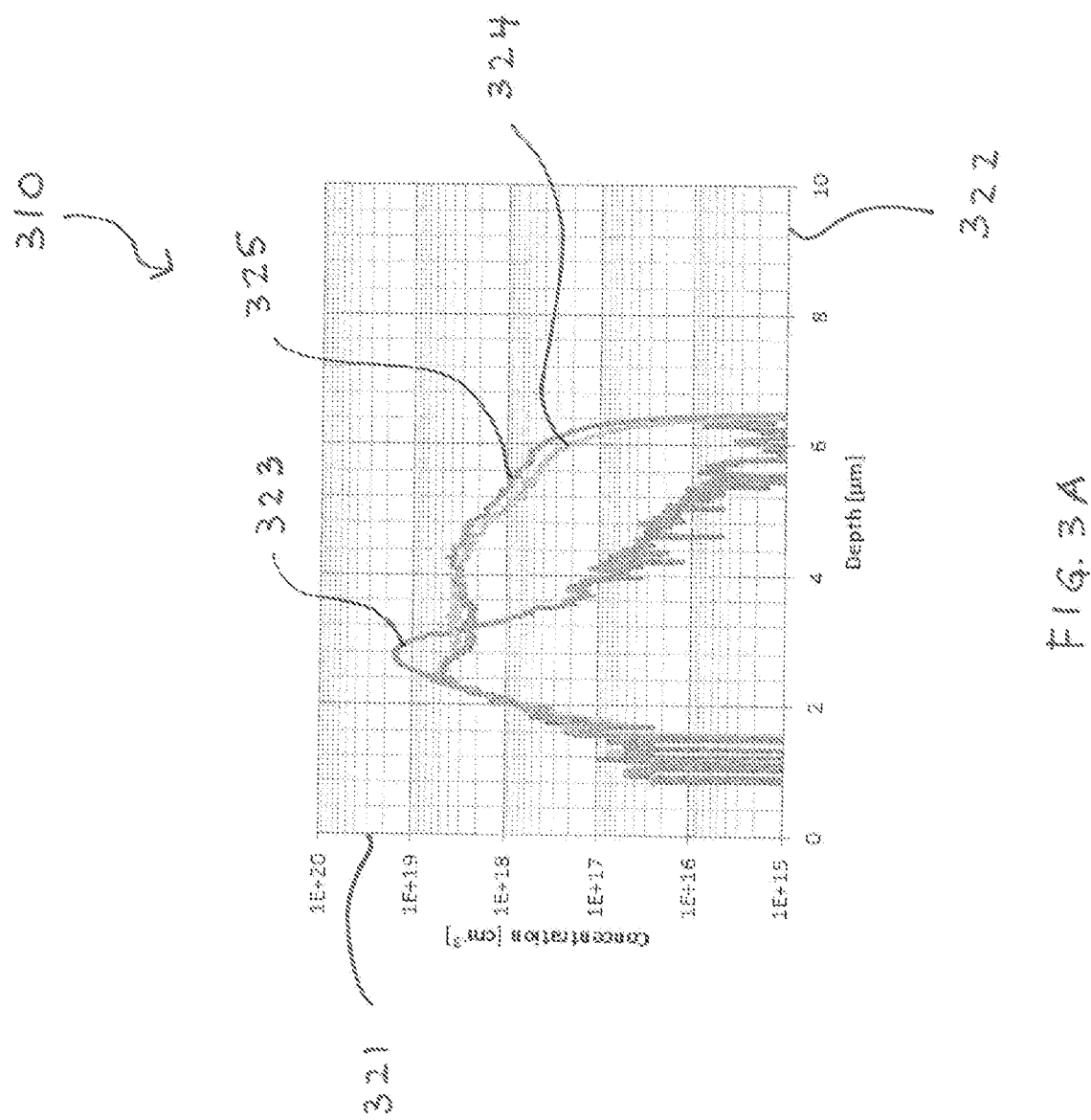

SEMICONDUCTOR DEVICE HAVING A DEVICE DOPING REGION OF AN ELECTRICAL DEVICE ARRANGEMENT

TECHNICAL FIELD

Embodiments relate to concepts for semiconductor device structures, and in particular to a semiconductor device and methods for forming a semiconductor device.

BACKGROUND

Inhomogeneity in dopant concentration profiles in semiconductor devices may lead to fluctuations in electrical characteristics (e.g. electric field strength, or conductivity) of the semiconductor devices. For example, inhomogeneity or irregularities in the doping concentration profiles in highly doped regions may lead to inhomogeneous electrical behavior. Furthermore, methods for the formation of highly doped regions may lead to increasing unwanted amorphization in the semiconductor substrate, for example.

SUMMARY

It is a demand to provide concepts for providing reliable semiconductor devices.

Some embodiments relate to a method for forming a semiconductor device. The method comprises implanting doping ions into a semiconductor substrate. A deviation between a main direction of a doping ion beam implanting the doping ions and a main crystal direction of the semiconductor substrate is less than ±0.5° during the implanting of the doping ions into the semiconductor substrate. The method further comprises controlling a temperature of the semiconductor substrate during the implantation of the doping ions so that the temperature of the semiconductor substrate is within a target temperature range for more than 70% of an implant process time used for implanting the doping ions. The target temperature range reaches from a lower target temperature limit to an upper target temperature limit. The lower target temperature limit is equal to a target temperature minus 30° C. The target temperature is higher than 80° C.

Some embodiments relate to a further method for forming a semiconductor device. The method comprises implanting a predefined dose of doping ions into a semiconductor substrate with an implant energy of at least 100 keV. A deviation between a main direction of a doping ion beam implanting the doping ions and a main crystal direction of the semiconductor substrate is less than ±0.5° during the implanting of the doping ions into the semiconductor substrate. The method further comprises controlling a temperature of the semiconductor substrate during the implantation of the predefined dose of doping ions so that the temperature of the semiconductor substrate is higher than 80° C. for more than 70% of an implant process time used for implanting the predefined dose of doping ions.

Some embodiments relate to a further method for forming a semiconductor device. The method comprises forming a scattering oxide layer over at least part of a main implantation surface of a semiconductor substrate. The method further comprises implanting a predefined dose of doping ions into a semiconductor substrate through the scattering oxide layer such that deeper doping regions are formed in regions the semiconductor substrate without the scattering oxide layer than in regions of the semiconductor substrate covered by the scattering oxide layer. The method further comprises controlling a temperature of the semiconductor substrate during the implantation of the predefined dose of doping ions so that the temperature of the semiconductor substrate is higher than 50° C. for more than 70% of an implant process time used for implanting the predefined dose of doping ions, Some embodiments relate to a semiconductor device. The semiconductor device comprises at least one device doping region of an electrical device arrangement disposed in a semiconductor substrate. The at least one device doping region has a vertical dimension of more than 500 nm. The portion of the at least one device doping region has a doping concentration of greater than $1*10^{15}$ dopant atoms per $cm^3$. The doping concentration of the portion of the at least one device doping region varies by less than 20% from a maximum doping concentration in the at least one device doping region.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which:

FIG. 1B shows a schematic illustration of the method for forming the semiconductor device;

FIG. 3A shows a diagram of a doping concentration ($cm^{-3}$) versus depth ($\mu m$), based on an implantation of phosphorus doping ions under different implantations conditions;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises." "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1A:
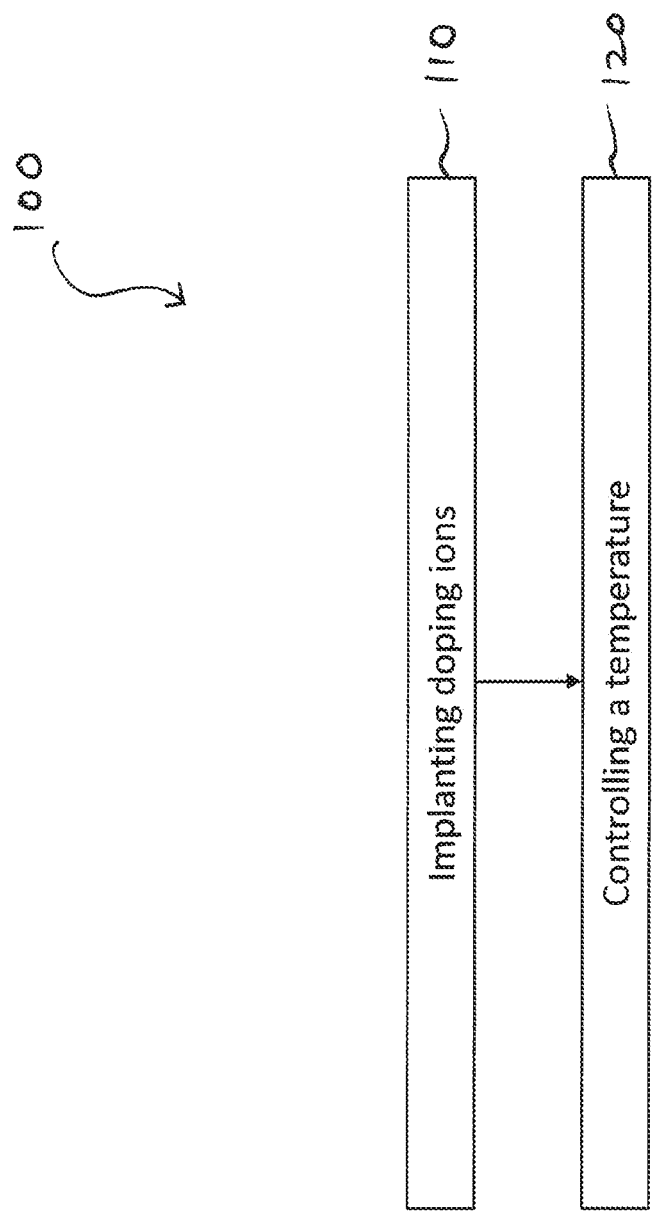
FIG. 1A shows a flow chart of a method for forming a semiconductor device.

FIG. 1A shows a flow chart of a method 100 for forming a semiconductor device according to an embodiment.

The method 100 comprises implanting 110 doping ions into a semiconductor substrate. A deviation between a main direction of a doping ion beam implanting the doping ions and a main crystal direction of the semiconductor substrate is less than ±0.5° during the implanting of the doping ions into the semiconductor substrate.

The method 100 further comprises controlling 120 a temperature of the semiconductor substrate during the implantation of the doping ions so that the temperature of the semiconductor substrate is within a target temperature range for more than 70% of an implant process time used for implanting the doping ions. The target temperature range reaches from a lower target temperature limit to an upper target temperature limit. The lower target temperature limit is equal to a target temperature minus 30° C. and the upper target temperature limit may be, for example, equal to the target temperature plus 30° C. The target temperature is higher than 80° C.

Due to the deviation between the main direction of the doping ion beam implanting the doping ions and the main crystal direction of the semiconductor substrate being less than ±0.5°, and controlling the temperature of the semiconductor substrate to within a target temperature range, improved doping profiles may be obtained. For example, a more homogeneous doping over a larger implantation depth or volume (e.g. larger than 100 nm) may be provided. For example, fluctuations in a doping concentration and/or unwanted amorphization in the semiconductor substrate may be reduced.

FIG. 1B shows a schematic illustration 150 of the method 100 for forming the semiconductor device.

The main direction of the ion beam 141 may be a direction in which the doping ions are accelerated towards the semiconductor substrate 102. For example, the main direction of the ion beam 141 may be a direction in which a majority of the doping ions (e.g. more than 80%, or more than 90%; or more than 99%) being implanted by an implantation apparatus or system are accelerated towards the semiconductor substrate 102 (ignoring a divergence of a minority of doping ions from the main direction of the ion beam 141), for example. An ion beam source generating the main ion beam as well as the beamline transporting the ion beam to the semiconductor may be adapted to generate an aligned low divergence implant ion beam. The divergence of the ion beam with respect to the main beam direction 141 (e.g. a main beam incidence angle divergence) may be monitored and re-adjusted by the ion beam and beamline source such that the beam divergence does not exceed ±0.2° from the main direction of the ion beam 141. A total main beam incidence angle divergence considering the beam divergence, a bowing of the semiconductor substrate 102 resulting from mechanical stress, a tilt of the surface of the semiconductor substrate 120 from the crystal plane (wafer cut) and other mechanisms is less than a critical angle e.g. less than ±0.5° (or e.g. less than ±0.3°, or e.g. less than ±0.2°, or e.g. less than ±0.15°, or e.g. less than ±0.1°).

At high implant energies, the critical angle at which channeling occurs, may be explained by the relationship $$\psi_C \approx \sqrt{\frac{2q_{Ion}q_T}{4\pi\varepsilon_0 dE_{Ion}}} \quad \text{for } E_{Ion} > 2\frac{q_{Ion}q_T}{4\pi\varepsilon_0}\frac{d}{a^2}.$$

$\psi_c$ may represent the critical angle at which channeling occurs, $q_{Ion}$ may represent the charge of the implanted ions entering or in the channel, $q_T$ may represent the charge of the medium in which the ion travels. $\varepsilon_0$ may represent the vacuum permittivity, d may represent the separation distance between atoms, $E_{Ion}$ may represent the energy of the implanted ions, and a may represent the screening length of the ion-atom interaction.

At low implant energies, the critical angle at which channeling occurs, may be explained by the relationship $$\psi_C \approx \sqrt{\frac{a}{d}\sqrt{\frac{3}{2}}\sqrt{\frac{2q_{Ion}q_T}{4\pi\varepsilon_0 dE_{Ion}}}} \quad \text{for } E_{Ion} < 2\frac{q_{Ion}q_T}{4\pi\varepsilon_0}\frac{d}{a^2}.$$

The main direction of the ion beam 141 may be a main direction of the ion beam 141 entering the semiconductor substrate 102 (or e.g. as the ion beam enters the semiconductor substrate 102). For example, the main direction of the ion beam 141 may be (or may be represented by) an angle of incidence of the ion beam at a lateral (implantation) surface of the semiconductor substrate 102, for example.

The main crystal direction 142 of the semiconductor substrate 102 may be a direction of a crystalline structure of the semiconductor substrate 102 at which the doping ions implanted into the semiconductor substrate 102 encounter minimal scattering or stopping power (e.g. resistance) in comparison to other directions of the crystalline structure of the semiconductor substrate 102. For example, the main crystal direction 142 of the semiconductor substrate 102 may be a direction of a crystal structure of the semiconductor substrate 102 which exhibits less stopping power (or deeper penetration depth) than other (crystallographic) directions.

The main crystal direction 142 of the semiconductor substrate 102 may be a direction of the crystalline structure of the semiconductor substrate 102 at which ion channeling of at least 70% (or at least 80% or at least 90%) of the implanted doping ions occurs in the semiconductor substrate 102. For example, at least 70% of the implanted doping ions may penetrate the semiconductor substrate 102 in the main crystal direction 142 by a penetration depth of at least 30% (or e.g. at least 10%, or at least 50%, or at least 100%) greater than a penetration depth in other crystallographic directions.

For example, the main crystal direction 142 may be a [110] direction of a diamond cubic crystal lattice of a (100) semiconductor substrate 102 (e.g. a silicon Si substrate). Alternatively, the main crystal direction 142 may be a [111] direction of a diamond cubic crystal lattice of the semiconductor (e.g. Si) substrate 102, for example. Alternatively or optionally, the main crystal direction 142 may be a direction (e.g. a [0001] direction) of a hexagonal (or wurtzite) crystal structure of the semiconductor substrate 102 (e.g. of a silicon carbide SiC or gallium nitride GaN substrate), for example.

The method may include controlling an angle between the main direction of the doping ion beam and a main lateral surface of the semiconductor substrate 102 during the implanting 110 of the doping ions into the semiconductor substrate 102, such that an angle of incidence of the doping ion beam deviates from the main crystal direction 142 by less than ±0.5° (or e.g. less than ±0.3°).

The deviation between the main direction of the doping ion beam 141 and the main crystal direction 142 of the semiconductor substrate 102 may be controlled in various ways. For example, the semiconductor substrate 102 may rest on or may be fixed at a substrate carrier. A first inclination sensor unit may sense an inclination of the substrate carrier or the semiconductor substrate 102 with regard to a reference plane or with regard to a main beam direction 141. Alternatively or additionally, a second inclination sensor unit may sense an inclination of the main beam direction 141 of an ion beam generated by an ion beam source with regard to a reference axis or with regard to the surface of the semiconductor substrate 102. A first actuator unit may adjust the inclination of the substrate carrier or the semiconductor substrate 102 in response to signals received from the first and/or second inclination sensor units. Alternatively or in addition, a second actuator unit may control the ion beam source to adjust the inclination of the main beam direction 141 in response to signals received from the first and/or second inclination sensor units.

The conditions concerning the main beam direction 141 and the main beam incidence angle divergence may be fulfilled for at least 80% of the surface of the semiconductor substrate 102 to be implanted. According to an embodiment the conditions concerning the main beam direction 141 and the main beam incidence angle divergence are fulfilled for at least 90% (or at least 95%) of the surface of the semiconductor substrate 102 to be implanted.

Using at least one of the inclination sensor units and at least one of the actuator units, the semiconductor substrate 102 may be aligned to the main beam direction 141 such that the main beam direction 141 at least approximately coincides with the main crystal direction 142, at a deviation between the main beam direction 141 and the main crystal direction 142 of less than ±0.5° (or e.g. less than ±0.3°, or e.g. less than ±0.15°, or e.g. 0°) The smaller the deviation the more pronounced is the channeling effect.

During the implantation 110 of the doping ions, an angle between the exposed semiconductor substrate 102 lateral surface and the main beam direction 141 may be sensed and re-adjusted such that the angle between the main beam direction 141 and the main crystal direction 142 is less than ±0.5° at a main beam incidence angle divergence of at most ±0.5°.

The deviation between a main direction of a doping ion beam implanting the doping ions and a main crystal direction of the semiconductor substrate is less than ±0.5° during the implanting of the doping ions into the semiconductor substrate (e.g. for more than 50%, or e.g. more than 60%, or e.g. more than 80%, or e.g. more than 90%, or e.g. more than 99% of the duration for implanting of the doping ions into the semiconductor substrate.

The lateral surface (or implantation surface) of the semiconductor substrate 102 may be the surface into (or froth) which the doping ions are implanted during manufacturing of the semiconductor device. For example, a lateral surface or a lateral dimension (e.g. a diameter or a length) of the main surface of the semiconductor structure may be more than 100 times larger (or more than 1000 times or more than 10000 times) than a distance between a first lateral surface of the semiconductor substrate 102 and a second opposite lateral surface of semiconductor substrate 102, for example, The implantation surface may be a frontside surface and/or a backside surface of the semiconductor substrate 102. For example, the frontside surface of the semiconductor substrate 102 may be a semiconductor surface of the semiconductor substrate 102 towards metal layers, insulation layers or passivation layers on top of the semiconductor surface. In comparison to a basically vertical edge (e.g. resulting from separating the semiconductor substrate 102 from others) of the semiconductor substrate 102, the surface of the semiconductor substrate 102 may be a basically horizontal surface extending laterally. The surface of the semiconductor substrate 102 may be a basically even plane (e.g. neglecting unevenness of the semiconductor structure due to the manufacturing process or trenches). For example, the frontside surface of the semiconductor substrate 102 may be the interface between the semiconductor material and an insulation layer, metal layer or passivation layer on top of the semiconductor substrate 102. For example, more complex structures may be located at the frontside surface of the semiconductor substrate 102 than at the backside of the semiconductor substrate 102. A backside surface of the semiconductor substrate 102 may be a side or surface of the semiconductor substrate 102 at which a backside metallization contact structure covering more than 50% (or e.g. more than 80%) of the backside surface of the semiconductor substrate 102 is to be formed (or is formed).

A vertical direction may be perpendicular or orthogonal to a lateral surface of the semiconductor substrate 102, for example.

The method may include implanting 110 the doping ions into the semiconductor substrate 102 at an implantation energy of greater than 100 keV. The doping ions may be accelerated by the ion implantation system to a desired energy. For example, the doping ions may be accelerated to implantation energy of at least 100 keV. The implantation energy of the doping ions may determine the depth of penetration and the doping profile in a vertical direction. For example, the implantation energy may be selected according to a desired depth of a maximum of donors generated based on the implanted doping ions or an end of range of the implanted doping ions. For example, an implant energy of at least 100 keV may be sufficient for implementing doping regions (e.g. a field stop region or a drift region) of various electrical elements (e.g. a transistor structure or a diode structure). For example, implantation energies higher than 200 keV (or higher than 500 keV or higher than 1000 keV or even higher than 3000 meV) may be used.

For example, a doping region formed by the implant of doping ions (e.g. at an end of range region of the doping ion implant) may be located at a depth with respect to a first surface of the semiconductor substrate 102 used for implanting the doping ions into the semiconductor substrate 102. The ratio between the concentration of dopants at the end of range of the doping ion implant and the concentration of dopants at one half of the end of range may depend on the substrate temperature during the implant of doping ions. For example, the ratio between the concentration of dopants at the end of range of the doping ion implant and the concentration of dopants at one half of the end of range may be adjusted or selected by selecting a corresponding temperature (a target temperature) of the semiconductor substrate 102 during the doping ion implantation.

The method may include implanting 110 the doping ions into the semiconductor substrate 102 at an implantation dose of greater than $1*10^{13}$ doping ions per cm$^2$ (or e.g. greater than $1*10^{14}$ doping ions per cm$^2$ or e.g. greater than $1*10^{15}$ doping ions per cm$^2$ or e.g. greater than $1*10^{16}$ doping ions per cm$^2$), for example. The (predefined) dose of doping ions to be implanted may be selected according to a desired doping profile or doping distribution within the semiconductor substrate 102 of the semiconductor device to be formed. For example, a base doping of the semiconductor substrate 102 or a doping region field stop region) of an electrical element (e.g. transistor or diode) may be implemented by implanting the predefined dose of doping ions.

The doping ions may include at least one doping ion type from the following group of doping ion types. The group of doping ion types may consist of: boron ions, phosphorus ions, aluminum ions, nitrogen ions, antimony ions, magnesium ions, indium ions, gallium ions or arsenic ions. Alternatively or optionally, the doping ions may be protons, for example.

The temperature of the semiconductor substrate 102 may be controlled 120 in various ways. For example, a substrate carrier (e.g. carrying the semiconductor substrate 102 during the doping ion implant) may comprise a means for heating and/or cooling the semiconductor substrate 102 (e.g. integrated heater device and/or cooling device) during the implantation of the doping ions. Additionally or alternatively, the implantation system used for implanting the doping ions may comprise a process chamber with a controllable temperature so that the temperature within the process chamber can be controlled during the doping ion implant. For example, the temperature of the semiconductor substrate 102 may be measured (e.g. by a temperature sensor at the semiconductor substrate 102 or by infrared temperature measurement) during the implantation of the predefined dose of doping ions and the temperature of the semiconductor substrate 102 may be adjusted (e.g. by adjusting a heat power of a means for heating and/or cooling the semiconductor substrate 102 and/or by adjusting a beam current of the doping ions) based on the measured temperature. For example, more than 50% or more than 70% (or more than 80% or more than 90%) of the heating energy provided to the semiconductor substrate 102 to heat the substrate to a desired target temperature range may be provided by the means for heating the semiconductor substrate 102 additionally to a heating energy generated by the beam of doping ions, if the implantation energies are greater than 100 keV.

The temperature of the semiconductor substrate 102 may be kept above 80° C. during more than 70% (or e.g. more than 50%) of an implant process time (or of a heating phase) used for implanting the predefined dose of doping ions. The implant process time may be a time during which the semiconductor substrate 102 is irradiated by a beam of doping ions contributing to the predefined dose of doping ions to be implanted. The predefined dose of doping ions may be implanted during one uninterrupted implant process. In this case, the implant process time may start when the doping ion beam is turned on and may end when the doping ion beam is turned off and the predefined dose of doping ions is implanted. Alternatively, the predefined dose of doping ions may be implanted during two or more implant sub-processes interrupted by implant breaks. In this case, the implant process time may be the summated time (e.g. beam time) during which the doping ion beam is turned on without adding the time of the implant breaks. The reason for the implant breaks may be to avoid uncontrolled self-heating effects, for example.

Furthermore, channeling may be sensitive to (or dependent on) interference of the crystalline channels, (e.g. by crystal damage or defects caused by implantation). Channeling implantation may also damage the crystal, which may lead to the accumulation (or increase) of defects in the channel. This may lead to increased interference of the crystalline channel, and a decrease in the channeling effect. The implantation temperature reduces the accumulated defects in the channel, for example.

An improvement of the doping efficiency of the implanted doping ions may be experienced already at temperatures higher than 50° C. or 80° C. The effect may be increased by selecting higher substrate temperatures during the doping ion implant. For example, the temperature of the semiconductor substrate 102 may be kept above 50° C. (or e.g. above 80° C., or e.g. above 120° C., or e.g. above 150° C., or e.g. above 200° C., or e.g. above 250° C.) for more than 70% of the implant process time used for implanting the predefined dose of doping ions.

For example, the semiconductor substrate 102 may be heated from room temperature to the target temperature or to the target temperature range higher than 80° C. at the beginning of the implant (e.g. during the implant process time) so that the semiconductor substrate 102 is not higher than 80° C. during the whole implant process time, but for more than 70% of the implant process time used for implanting the predefined dose of doping ions. Alternatively, the semiconductor substrate 102 may be heated to the target temperature or to the target temperature range higher than 80° C. before the beginning of the implant of the doping ions. In this way, the temperature of the semiconductor substrate 102 may be temperatures higher than 80° C. for the whole or nearly the whole implant process time. For example, the temperature of the semiconductor substrate 102 is controlled so that the temperature of the semiconductor substrate 102 is higher than 80° C. for more than 90% (or more than 95% or more than 99%) of the implant process time used for implanting the predefined dose of doping ions.

The semiconductor substrate 102 may be a semiconductor wafer, a part of a semiconductor wafer or a semiconductor die. The semiconductor substrate 102 of the semiconductor device may be a silicon (Si) substrate or silicon wafer. Alternatively, the semiconductor substrate 102 of the semiconductor device may be a silicon carbide (SiC) substrate, a gallium arsenide (GaAs) substrate or a gallium nitride (GaN) substrate, for example.

The method 100 may achieve a suppression of amorphization of the substrate (in deep vertical profiles) during ion implantation. This may be achieved through increasing the substrate temperature during the processing. Under channeling conditions, deep rectangular profiles may be formed in the semiconductor components, with orders of magnitude larger dopant concentrations (e.g. larger than $1*10^{19}$ dopant atoms per cm$^3$, or e.g. larger than $1*10^{20}$ dopant atoms per cm$^3$, or e.g. larger than $1*10^{16}$ dopant atoms per cm$^3$, or e.g. larger than $1*10^{17}$ dopant atoms per cm$^3$, or e.g. larger than $1*10^{18}$ dopant atoms per cm$^3$).

The implantation 110 of the doping ions may be performed such that at least one device doping region comprising a maximal doping concentration of larger than $1*10^{15}$ dopant atoms per cm$^3$ (or e.g. larger than $1*10^{16}$ dopant atoms per cm$^3$ or e.g. larger than $1*10^{17}$ dopant atoms per cm$^3$ or e.g. larger than $1*10^{18}$ dopant atoms per cm$^3$, or e.g. larger than $1*10^{19}$ dopant atoms per cm$^3$ or e.g. larger than $1*10^{20}$ dopant atoms per cm$^3$) formed in the semiconductor substrate 102.

The implantation of the doping ions may be performed such that a portion of the at least one device doping region comprising a doping concentration which varies from a maximum (or largest) doping concentration by less than 60% (or e.g. less than 50%, or e.g. less than 30%) of the maximum doping concentration in the at least one device doping region is formed in the semiconductor substrate 102. For example, the at least one doping region may have a vertical dopant profile showing a low deviation. The doping concentration of the at least one device doping region deviates or varies by less than 60% (or e.g. less than 50%, or e.g. less than 30%) from the maximum doping concentration in the at least one device doping region in at least 50% (or e.g. at least 40%) of the respective total vertical extension of the at least one device doping region (or implant zone or implant region).

The at least one device doping region (or the at least one implant zone) may have a vertical dimension of at least 100 nm (or e.g. at least 1 µm, or e.g. at least 2 µm, or e.g. at least 3 µm, or e.g. at least 5 µm, or e.g. at least 10 µm), for example.

As an example, a maximum doping concentration in the at least one device doping region may be $5*10^{18}$ dopant atoms per cm$^3$. A deviation of the doping concentration of 60% of the maximum doping concentration in the at least one device doping region may be $3*10^{18}$ dopant atoms per cm$^3$. Thus, the doping concentration may vary between $2*10^{18}$ dopant atoms per cm$^3$ and $5*10^{18}$ over at least 40% (e.g. over at least 2.5 µm) of the total vertical extension (e.g. about 5.5 µm) of the at least one device doping region.

A doping concentration of the at least one device doping region may vary from a maximum (or largest doping concentration) by less than 80% of the maximum doping concentration over at least 55% (or e.g. at least 60%) of the respective total vertical extension of the at least one device doping region. As an example, a maximum doping concentration in the at least one device doping region may be $5*10^{18}$ dopant atoms per cm$^3$. A deviation of the doping concentration of 80% of the maximum doping concentration in the at least one device doping region may be $4*10^{18}$ dopant atoms per cm'. Thus, the doping concentration may vary between $1*10^{18}$ dopant atoms per cm$^3$ and $5*10^{18}$ over at least 55% (e.g. over at least 3.2 µm) of the total vertical extension (e.g. about 5.5 µm) of the at least one device doping region.

A maximum (or largest or highest) doping concentration in the at least one device doping region may deviate from a lowest minimum value in a portion of the at least one device doping region by less than a factor of 5 (or e.g. less than a factor of 4), for example. The portion of the at least one device doping region may extend over at least 55% (or e.g. at least 60%) of the respective total vertical extension of the at least one device doping region, for example. As an example, a maximum doping concentration in the at least one device doping region may be $5*10^{18}$ dopant atoms per cm$^3$, and lowest minimum value in the portion of the at least one device doping region may be $1.25*10^{18}$ dopant atoms per cm$^3$ for a deviation of less than a factor of 4.

The implantation 110 of the doping ions may be performed such that less than 30% (or e.g. less than 20%, or e.g. less than 10%) of the semiconductor material of the semiconductor substrate 102 changes into an amorphous (or disordered, or non-crystalline) state during the implantation of the doping ions, or e.g. without additional annealing process. For example, amorphization of the semiconductor substrate 102 may be significantly suppressed or reduced even without additional annealing processes after the implantation of the doping ions.

The method 100 may be used to form device doping regions of an electrical device arrangement. The electrical device arrangement may include vertical transistor structures or vertical diode structures, for example. The electrical device arrangement may be a (vertical) metal oxide semiconductor field effect transistor arrangement (MOSFET), an (vertical) insulated gate bipolar transistor arrangement (IGBT), a (vertical) thyristor arrangement, or a (vertical) diode arrangement, for example.

Optionally or alternatively, the implantation 110 of the doping ions may be performed to form backside dopant profiles (e.g. for field stops), for example. These may improve the setting of the backside emitter efficiency and/or the field-stop doping regions. For example, a thermal budget for activating the dopant profile may be significantly decreased. A plateau or rectangular-shaped dopant profile with concentrations greater than $10^{17}$ cm$^{-2}$ may be formed with small thermal budget (e.g. from 300° C. to 420° C.). The realization of p-doped (and n-doped) islands which may be buried below the semiconductor surface or may be in contact with the semiconductor surface may be possible, for example. The implantation 110 of the doping ions may be performed to form a field stop region, a drift region, a channel stopper region or a body region of a vertical transistor arrangement or a vertical diode arrangement of the semiconductor device, or to form a cathode/anode region of a vertical diode arrangement, or a collector/emitter region or a source/drain region of a vertical transistor arrangement. The vertical depth of these doping regions may be larger than 100 nm (or e.g. larger than 5 µm, or e.g. larger than 10 µm), for example.

Optionally or alternatively, the implantation 110 of the doping ions may be performed to form body regions or zones with plateau-like (or flat like) dopant profiles. These body regions may be used to suppress latch up in IGBTs and power MOSFETs, for example. Optionally or alternatively, the implantation 110 of the doping ions may be performed to form deep reaching highly n-doped field stop zones (e.g. having a vertical depth of greater than 100 nm) for IGBTs, diodes or MOSFETs, for example. Optionally or alternatively, the implantation 110 of the doping ions may be performed to form relatively highly doped drift zones or regions in SiC components, for example.

Optionally or alternatively, the implantation 110 of the doping ions may be performed to form a graded doping profile. For example, the method may include forming a device doping region comprising a graded doping profile by forming a scattering oxide layer having a thickness of at least 10 nm (or e.g. at least 30 nm) over at least part of a main implantation surface of the semiconductor substrate, and implanting the doping ions into the semiconductor substrate through the scattering oxide layer such that deeper doping regions are formed in regions the semiconductor substrate without the scattering oxide layer than in regions of the semiconductor substrate covered by the scattering oxide layer. Alternatively or optionally, the scattering oxide layer may be a layer having varying thicknesses or portions of different thicknesses. As the doping regions may spread more deeply into regions of the semiconductor substrate masked with thinner scattering oxide, and less deeply into regions of the semiconductor substrate masked with thicker scattering oxide, a graded doping profile may be obtained in the semiconductor substrate, for example.

For example, the implantation 110 of the doping ions may be performed to form graded field stop profiles through local introduction of the thin screening (or spreading) oxide layer. For example, the device doping regions formed by method TOO may include a graded backside emitter through local introduction of thin screen oxide. Alternatively or optionally, the device doping regions formed by method 100 may include graded field stop regions, graded emitter regions or graded n-type shorting regions, which may be formed without subsequent annealing.

Optionally or alternatively, the implantation 110 of the doping ions may be performed to form a plurality of vertically extending compensation regions of a compensation device arrangement located adjacently to a plurality of vertically extending drift regions of the compensation device arrangement in the semiconductor substrate 102. The plurality of vertically extending compensation regions and the plurality of vertically extending drift regions of the compensation device arrangement may be arranged alternatingly in the semiconductor substrate 102 in a lateral direction, for example. Optionally or alternatively, the implantation 110 of the doping ions may be performed to form CoolMOS pillars (e.g. compensation regions and/or drift regions) a compensation semiconductor device.

Optionally or alternatively, the implantation 110 of the doping ions may be performed to form a plurality of device doping regions adjacently to a backside of the semiconductor substrate 102. The device doping regions of the plurality of device doping regions may be laterally surrounded by a cathode/anode region of a vertical diode arrangement, or a source/drain or collector/emitter region of a vertical transistor arrangement. For example, the device doping regions may be formed by implantation after forming the cathode/anode regions, the source/drain regions or the collector/emitter regions. For example, the implantation 110 of the doping ions may be performed to form buried backside (or frontside) p-type islands (or n-type islands) for diodes to increase the softness during switch off.

Optionally or alternatively, the implantation 110 of the doping ions may be performed to form relatively deep (e.g. deeper than 100 nm or e.g. greater than 5 μm) backside n-type emitter (or p-type emitter) of (vertical) diodes or a backside p-type emitter (or n-type emitter) for (vertical) IGBTs.

Optionally or alternatively, the implantation 110 of the doping ions may be performed to form deeply reaching (e.g. deeper than 100 nm, or e.g. deeper than 500 nm, or e.g. deeper than 1 μm or e.g. deeper than 5 μm) "junction termination extension" structures or "variation of lateral doping" structures.

Optionally or alternatively, the implantation 110 of the doping ions may be performed to form deeply reaching channel stopper regions Which may be used to avoid channel inversion, for example.

Optionally or alternatively, the implantation 110 of the doping ions may be performed to form a buried (Ge) doped layer or region in a highly doped semiconductor substrate 102 near the boundary between the drift zone and the semiconductor substrate 102. Due to the phosphorus induced tensions being largely compensated, the tensions due to the growth of the epitaxial zone may be avoided. The (Ge) doped layer may have a plateau-forming profile with sufficiently extensive slopes or spurs in both vertical directions (e.g. vertical extension of the slopes e.g. between 10% and 50% of the plateau extension).

Deep highly doped doping profiles may be of interest in many applications. For example, they may be used in pillar structures for compensation devices (e.g. CoolMOS) or to generate structures with different useful voltages, for example. In compensation components, general technologies may be used to realize vertical pillars or layers. For example, these may be carried out by multiple epitaxy and masked boron (B) and phosphorus (P) implantation. Vertical and lateral fluctuations of the dopant concentration in the compensation layer may lead to inhomogeneous distributions of the electric field strength, which may limit the maximal received voltage. Furthermore, with a fluctuating dopant concentration along the n-type (or p-type) pillar, an optimal conductivity (Ron) is not achievable, for example. To reduce the fluctuations and the lateral expansion of region, epitaxial layers and implantation may be used, which increase the cost of manufacturing the required structures. The method 100 avoids an increasing amorphization of the semiconductor substrate 102 with doping concentrations greater than $1*10^{16}$ dopant atoms per $cm^3$ (or e.g. greater than $1*10^{17}$ dopant atoms per $cm^3$). The method 100 further avoids that implanted ions no longer follow the required path in the semiconductor in order to form a channeling profile.

For channeling implantation, a higher substrate temperature of above 50° C. (or e.g. above 80° C., or e.g. between 100° C. and 500° C., or e.g. between 100° C. and 300° C.) may be used. At a substrate temperature of above 50° C., (or e.g. above 80° C., or e.g. above 100° C.), the amorphisation may decrease and the attainable concentration (of $1*10^{18}$ dopant atoms per $cm^3$) in the channeling profile may increase, for example.

Figure 2:
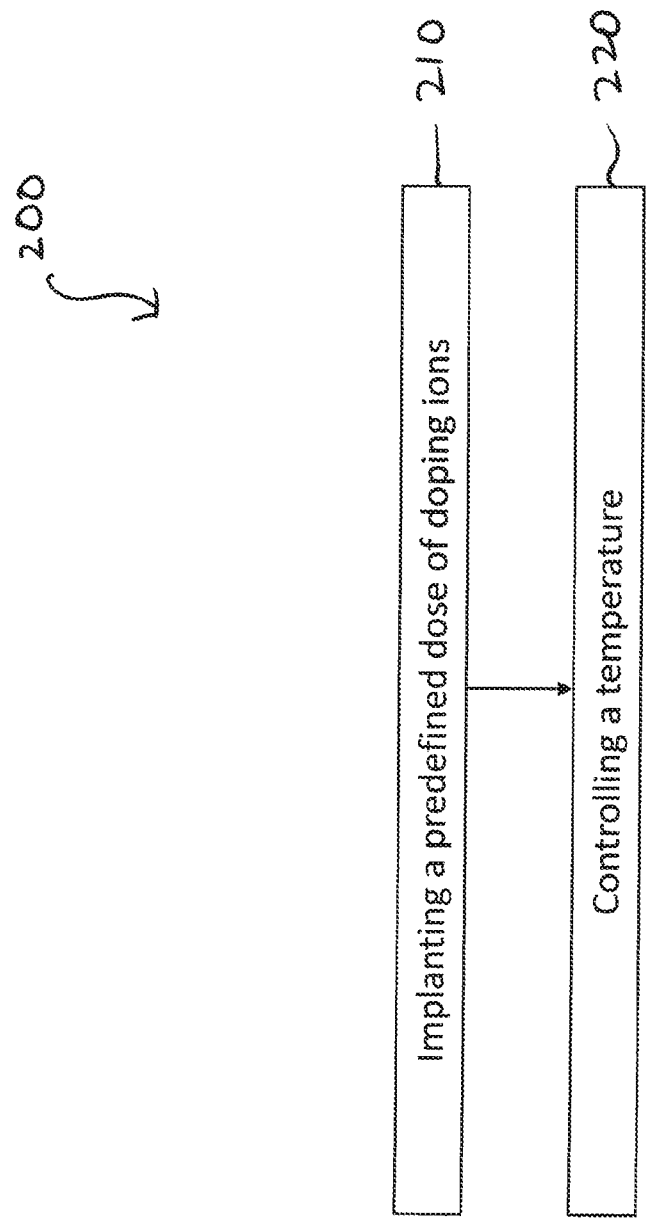
FIG. 2 shows a flow chart of a further method for forming a semiconductor device.

FIG. 2 shows a method 200 for forming a semiconductor device according to an embodiment.

The method 200 comprises implanting 210 a predefined dose of doping ions into a semiconductor substrate with an implant energy of at least 100 keV. A deviation between a main direction of a doping ion beam implanting the doping ions and a main crystal direction of the semiconductor substrate is less than ±0.5° during the implanting of the doping ions into the semiconductor substrate.

The method 200 further comprises controlling 220 a temperature of the semiconductor substrate during the implantation of the predefined dose of doping ions so that the temperature of the semiconductor substrate is higher than 80° C. for more than 70% of an implant process time used for implanting the predefined dose of doping ions.

Due to the deviation between the main direction of the doping ion beam implanting the doping ions and the main crystal direction of the semiconductor substrate being less than ±0.5°, and the controlling of the temperature of the semiconductor substrate to within a target temperature range, improved doping profiles may be obtained, for example. For example, a more homogeneous doping over a larger depth or volume may be provided. For example, fluctuations in a doping concentration and/or unwanted amorphization in the semiconductor substrate may be reduced.

The implant energy of at least 100 keV may be sufficient for implementing doping regions (e.g. field stop region or drift region) of various electrical elements (e.g. transistor structures or diode structures). For example, implantation energies higher than 200 keV (or higher than 500 keV or higher than 1000 keV or even higher than 3000 MeV) may be used.

For example, the implantation of the predefined dose of doping ions may be performed to provide a field stop region or field stop layer of a vertical transistor arrangement or a vertical diode arrangement at a predefined depth. The field stop region may be located between a drift region and a backside doping region (e.g. drain region, collector region, cathode region or anode region) of a vertical transistor arrangement or a vertical diode arrangement. The field stop region may be located in a depth being reachable by doping ions with an energy of less than 4.0 MeV or even less than 2.5 MeV (or less than 1.5 MeV).

Optionally, a base doping (e.g. doping of the drift region of a transistor or a diode) of the semiconductor substrate and the field stop region may be implanted simultaneously. The implantation of the predefined dose of doping ions may be performed to provide simultaneously a base doping of the semiconductor substrate between the predefined depth and a surface of the semiconductor substrate. For example, the semiconductor substrate temperature may be selected so that the doping concentration obtained within the portion of the semiconductor substrate between the surface and the end of range peak of the doping ion implant (penetration area) forms the base doping of this portion and the end of range peak forms a doping concentration desired for the field stop region.

Alternatively, the implantation of the base doping (e.g. doping of the drift region of a transistor or a diode) of the semiconductor substrate may be performed independent or separate from the implant of the field stop region. The implantation of the base doping may be performed at higher implant energies (e.g. more than 3 MeV or more than 3.5 MeV). The end of range of the implantation of the base doping may be deeper than a thickness of the semiconductor substrate of the final semiconductor device (e.g. the end of range portion may be removed by grinding the substrate). The semiconductor substrate may reach very high temperatures, if implant energies higher than 3.5 MeV are used. The doping efficiency may be increased and/or the process time may be reduced by controlling (e.g. heating and/or cooling the substrate carrier or the process chamber) the temperature of the semiconductor substrate.

The doping ions may be implanted with an implantation dose of greater than $1*10^{13}$ doping ions per $cm^2$ (or e.g. greater than $1*10^{14}$ doping ions per $cm^2$ or e.g. greater than $1*10^{15}$ doping ions per $cm^2$ or e.g. greater than $1*10^{16}$ doping ions per $cm^2$), for example. The (predefined) dose of doping ions to be implanted may be selected according to a desired doping profile or doping distribution within the semiconductor substrate of the semiconductor device to be formed. For example, a base doping of the semiconductor substrate or a doping region (e.g. field stop region) of an electrical element (e.g. transistor or diode) may be implemented by implanting the predefined dose of doping ions or ions which form complexes in the semiconductor wafers which act as donors or acceptors.

The semiconductor substrate may be heated by an external heater (e.g. a heatable chuck or a heatable substrate carrier) from room temperature to a desired target temperature or process temperature. Then, the implantation of the doping ions may start and continue until the predefined dose of doping ions is implanted. The substrate may be actively cooled after the implantation (e.g. through the chuck or substrate carrier).

The temperature of the semiconductor substrate may be kept substantially constant due to the proposed temperature control. For example, the temperature of the semiconductor substrate may be controlled during the implantation of the predefined dose of doping ions so that the temperature of the semiconductor substrate is within a target temperature range for more than 70% of an implant process time used for implanting the predefined dose of doping ions. The target temperature range may reach from a lower target temperature limit to an upper target temperature limit. The lower target temperature limit may be equal to a target temperature minus 30° C. (or minus 10° C. or minus 5° C. or minus 5° C.) and the upper target temperature limit may be equal to the target temperature plus 30° C. (or plus 10° C. or plus 5° C. or plus 50° C.). In other words, the temperature of the semiconductor substrate may be controlled to stay within a target temperature range of a target temperature +/−50° C., +/−30° C., 10° C. or +/−5° C. for more than 70% of the implant process time used for implanting the predefined dose of doping ions. The target temperature may be higher than 80° C. (or higher than 120° C., higher than 150° C., higher than 200° C. or higher than 250° C.). For example, the lower target temperature limit may be higher than 80° C. as well.

Optionally or alternatively, the semiconductor substrate may be heated by using heated chucks to a target temperature of between 500° C. and 700° C., for example.

Additionally or optionally, the concentration limit for a desired basic physical effect may be (finely) adjusted by a beam current during implantation. For example, the concentration may be increased after every temperature (or heating) phase, for example.

More details and aspects are mentioned in connection with the embodiments described above or below. The embodiments shown in FIG. 2 may comprise one or more optional additional features corresponding to one or more aspects mentioned in connection with the proposed concept or one or more embodiments described above (e.g. FIG. 1) or below (e.g. FIGS. 3A to 5).

FIG. 3A shows a diagram 310 of a doping concentration ($cm^{-3}$) versus depth (μm) based on an implantation of phosphorus doping ions under different implantations conditions. For example, FIG. 3A shows the distributions of phosphorus doping ions after a channeling high energy implant at different temperatures.

The doping ions may be implanted such that deviation between a main direction of a doping ion beam implanting the doping ions and a main crystal direction of the semiconductor substrate is less than ±0.5° (or e.g. 0°), for example. The doping ions may be implanted at an implantation dose of at least $1*10^{14}$ doping ions per $cm^2$, for example. The doping ions may be implanted into a silicon (100) substrate at an implantation energy of 3.5 MeV, for example.

Without further measures 323 (e.g. without controlling the deviation between a main the main ion beam direction and a main crystal direction, and/or e.g. without controlling the temperature as described in connection with FIGS. 1 to 2), a clear amorphisation in the substrate may occur at implantation doses over $1*10^{13}$ doping ions per $cm^2$ and at an implantation temperature of about 25° C. (room temperature), and minimal channeling of the ions may occur. With an increased implantation target temperature 324 above 50° C., or e.g. above 80° C., or e.g. at 100° C.), the amorphisation limit may be significantly increased through the increased self-annealing rate of the crystal lattice of the semiconductor substrate, so that the distribution has significantly more channeling portions. For example, by controlling the implantation target temperature of the semiconductor substrate during the implantation of the doping ions, the amorphisation of the semiconductor substrate which may otherwise begin to occur at room temperatures at implantation doses over $1*10^{13}$ doping ions per cm$^2$ may begin only at temperatures above 50° C. e.g. at least 25° C. above room temperature (25° C.) instead of at room temperatures. For example, the amorphisation of the semiconductor substrate which may occur at room temperature may be reduced or suppressed. An optimal attainable state 325 may be carried out at an implantation target temperature between 200 and 300° C., for example.

The high implantation temperature changes the amorphization limit, the defect density and the degree of activation of the implanted dopant. For example, a higher degree of activation of the implanted dopant ions may mean that more than 30% (or e.g. more than 50%, or e.g. more than 80%, or e.g. more than 90%) of the doping ions implanted into the semiconductor substrate are activated compared to a lower percentage without the high implantation temperature. This may be the case even for implantation doses (e.g. less than $1*10^{13}$ doping ions per cm$^2$) for which amorphisation of the semiconductor substrate does not occur (or at which very little amorphisation of the semiconductor substrate occurs) at room temperature. For example, the sheet resistance and/or activation of the implanted doping ions may decrease as the implantation temperature increases.

Figure 3B:
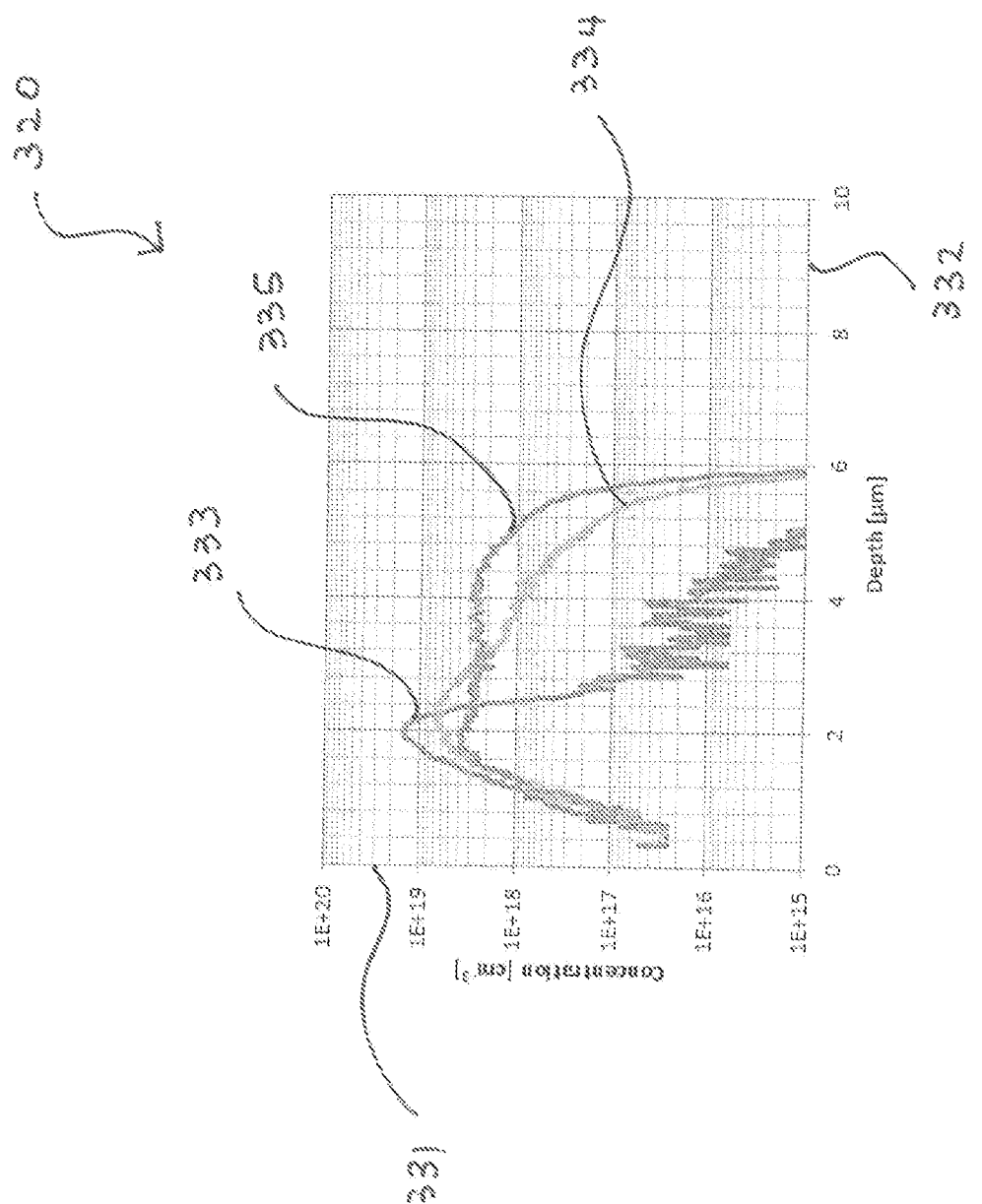
FIG. 3B shows a diagram of a doping concentration ($cm^{-3}$) versus depth ($\mu m$) based on an implantation of arsenic doping ions under different implantations conditions.

FIG. 3B shows a diagram 320 of a doping concentration (cm$^{-3}$) versus depth (μm) based on an implantation of arsenic doping ions under different implantation conditions. For example, FIG. 3B shows the distributions of arsenic doping ions after a channeling high energy implant at different temperatures.

The doping ions may be implanted such that deviation between a main direction of a doping ion beam implanting the doping ions and a main crystal direction of the semiconductor substrate is less than ±0.5° (or e.g. 0°), for example. The doping ions may be implanted at an implantation dose of at least $1*10^{14}$ doping ions per cm$^2$, for example. The doping ions may be implanted into a silicon (100) substrate at an implantation energy of 2.5 MeV, for example.

Without further measures 333 (e.g. without controlling the deviation between a main the main ion beam direction and a main crystal direction, and/or e.g. without controlling the temperature as described in connection with FIGS. 1 to 2), a clear amorphisation in the substrate may occur at implantation doses over $1*10^{13}$ doping ions per cm$^2$ and at an implantation temperature of about 25°, and minimal channeling of the ions may occur. With an increased implantations target temperature 334 (e.g. above 50° C., e.g. above 80° C., or e.g. at 100° C.), the amorphisation limit may be significantly increased through the increased self-annealing rate of the crystal lattice of the semiconductor substrate, so that the distribution has significantly more channeling portions. An optimal attainable state 335 may be carried out at an implantations target temperature of between 200 and 300° C. The high implantations temperature changes the amorphisation limit, the degree of crystal damage and the degree of activation of the implanted dopant.

More details and aspects are mentioned in connection with the embodiments described above or below. The embodiments shown in FIGS. 3A and 3B may comprise one or more optional additional features corresponding to one or more aspects mentioned in connection with the proposed concept or one or more embodiments described above (e.g. FIGS. 1 to 2) or below (e.g. FIG. 5).

Figure 4:
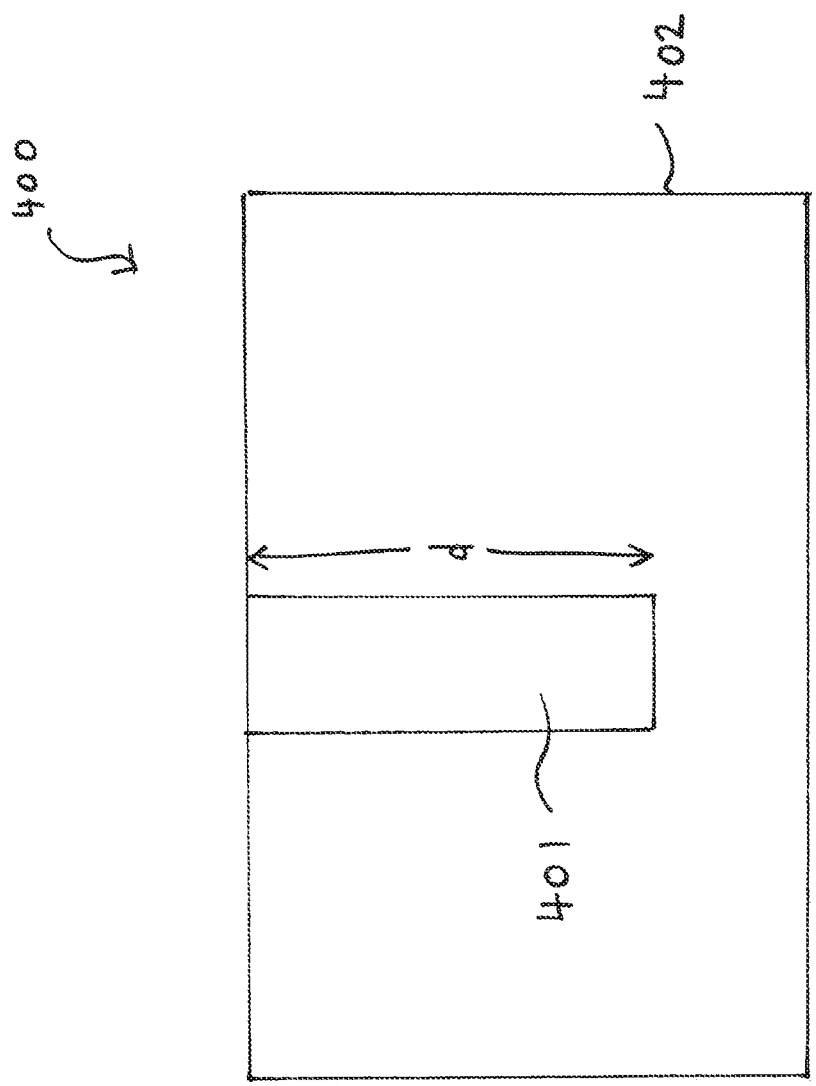
FIG. 4 shows a schematic illustration of a semiconductor device.

FIG. 4 shows a schematic illustration of a semiconductor device 400 according to an embodiment.

The semiconductor device 400 comprises at least one device doping region 401 of an electrical device arrangement arranged in a semiconductor substrate 402.

The at least one device doping region 401 or a portion of the at least one device doping region 401 has a vertical dimension, d, of more than 500 nm.

A (or the) portion of the at least one device doping region 401 has a doping concentration 403 of greater than $1*10^{15}$ dopant atoms per cm$^3$. The doping concentration of the portion of the at least one device doping region 401 varies by less than 20% from a maximum doping concentration in the at least one device doping region.

Due to the doping concentration of the portion of the at least one device doping region 401 varying by less than 20% from a maximum doping concentration in the at least one device doping region, consistency and reliability of semiconductor devices 400 may be improved. For example, fluctuations in electrical characteristics (e.g. electric field strength, or conductivity) in the semiconductor device 400 may be reduced, for example.

The electrical device arrangement may be a vertical transistor arrangement or a vertical diode arrangement. For example, the vertical transistor arrangement may be a field-effect transistor arrangement (e.g. metal oxide semiconductor transistor or insulated gate bipolar transistor), for example. For example, the electrical device arrangement may be a (vertical) thyristor arrangement, or a (vertical) diode arrangement.

The vertical transistor arrangement may comprise a plurality of cells or repeated structures (e.g. field effect transistor cells, metal oxide semiconductor transistor cells or insulated gate bipolar transistor cells) within a cell field. For example, a field effect transistor cell may comprise a source region, a body region, a drain region (e.g. shared with other cells) and a gate for controlling a channel through the body region. Further, the vertical transistor arrangement may comprise a field stop region or field stop layer between the body region (or drift region) and the drain region.

The semiconductor device may be a power semiconductor device having a breakdown voltage or blocking voltage of more than more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V or 2000V).

The at least one doping region 401 or the portion of the at least one device doping region 401 may have a vertical dopant profile having a low deviation of less than 20% (or e.g. less than 10%) over at least 50% (or e.g. at least 70% or at least 90%) of the respective total vertical extension, d, of the at least one device doping region or the portion of the at least one device doping region 401. According to an embodiment the deviation within each implant zone may be less than 20% for more than 50% of a vertical extension of the implant zone.

The at least one device doping region or the portion of the at least one device doping region 401 (or the at least one implant zone) may have a vertical dimension of at least 100 nm (or e.g. at least 2 µm, or e.g. at least 5 µm, or e.g. at least 10 µm, or e.g. more than 500 nm or e.g. more than 1000 nm or e.g. more than 3000 nm).

A (or the) portion of the at least one device doping region 401 has a doping concentration 403 of greater than $1*10^{15}$ dopant atoms per cm$^3$ (or e.g. larger than $1*10^{16}$ dopant atoms per cm$^3$ or e.g. larger than $1*10^{17}$ dopant atoms per cm$^3$ or e.g. larger than $1*10^{18}$ dopant atoms per cm$^3$, or e.g. larger than $1*10^{19}$ dopant atoms per cm$^3$ or e.g. larger than $1*10^{20}$ dopant atoms per cm$^3$).

Optionally or alternatively, the at least one doping region 401 may be a plurality of vertically extending compensation regions of a compensation device arrangement. Optionally or alternatively, the at least one doping region 401 may be a plurality of vertically extending drift regions of the compensation device arrangement. Optionally or alternatively, the at least one doping region 401 may be a buried backside (or frontside) p-type island (or n-type island) for diodes to increase the softness during switch off. Optionally or alternatively, the at least one doping region 401 may be a backside (or frontside) n-type emitter (or p-type emitter) of (vertical) diodes or a backside p-type emitter (or n-type emitter) for (vertical) IGBTs. Optionally or alternatively, the at least one doping region 401 may be a "junction termination extension" structure or a "variation of lateral doping" structure. Optionally or alternatively, the at least one doping region 401 may be a channel stopper region which may be used to avoid channel inversion, for example. Optionally or alternatively, the at least one doping region 401 may be a graded doping region. For example, device doping region may have a graded doping profile. Optionally, the device doping region 401 formed may include or may be a graded field stop regions, graded emitter regions or graded n-type shorting regions.

More details and aspects are mentioned in connection with the embodiments described above or below. The embodiments shown in FIG. 4 may comprise one or more optional additional features corresponding to one or more aspects mentioned in connection with the proposed concept or one or more embodiments described above (e.g. FIGS. 1 to 3B) or below (FIG. 4).

Figure 5:
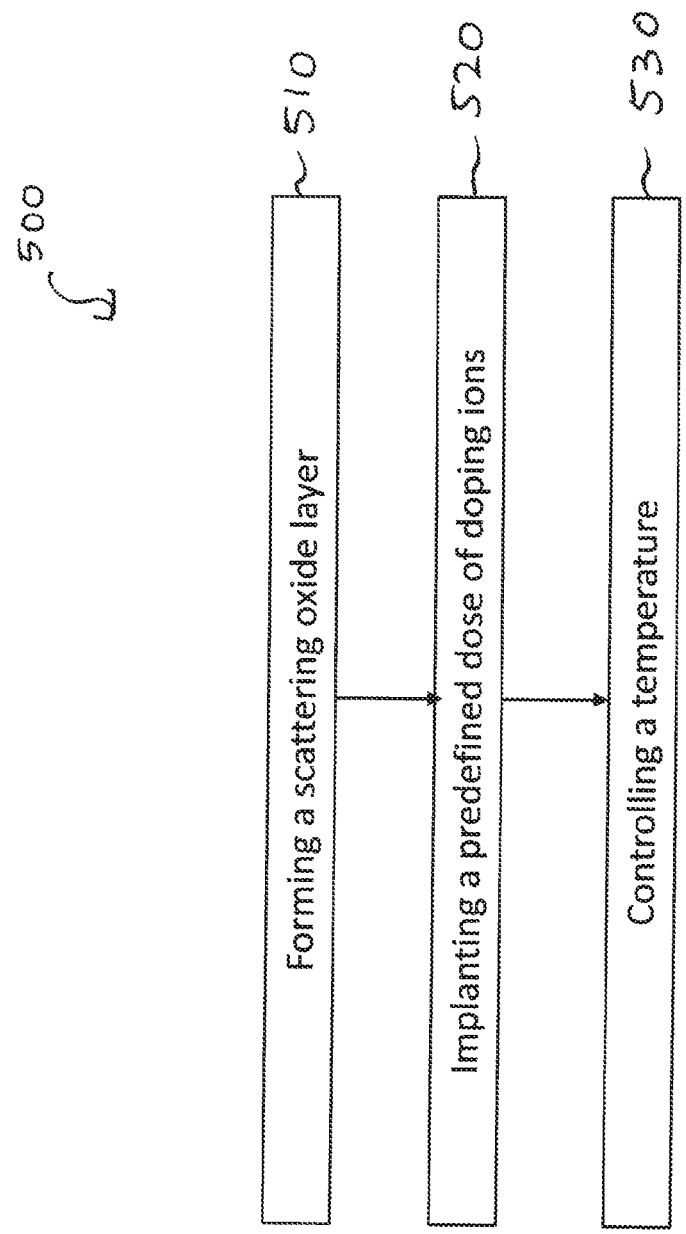
FIG. 5 shows a flow chart of a further method for forming a semiconductor device.

FIG. 5 shows a flow chart of a method 500 for forming a semiconductor device.

The method comprises forming 510 a scattering oxide layer over at least part of a main implantation surface of a semiconductor substrate.

The method further comprises implanting 520 a predefined dose of doping ions into a semiconductor substrate through the scattering oxide layer such that deeper doping regions are formed in regions the semiconductor substrate without the scattering oxide layer than in regions of the semiconductor substrate covered by the scattering oxide layer;

The method further comprises controlling 530 a temperature of the semiconductor substrate during the implantation of the predefined dose of doping ions so that the temperature of the semiconductor substrate is higher than 50° C. for more than 70% of an implant process time used for implanting the predefined dose of doping ions.

Due to the forming of the scattering oxide layer over at least part of the main implantation surface of the semiconductor substrate, a higher degree of activation of the implanted ions may be achieved at higher implantations temperature. For example, the higher degree of activation may be achieved even without channeling.

A higher degree of activation of the implanted dopant ions may mean that more than 30% (or e.g. more than 50%, or e.g. more than 80%, or e.g. more than 90%) of the doping ions implanted into the semiconductor substrate are activated compared to a lower percentage without the high implantation temperature.

The scattering oxide layer may be similar to the scattering oxide layer described in connection with FIG. 1 For example, the method may include forming a device doping region comprising a graded doping profile by forming the scattering oxide layer having a thickness of at least 10 nm (or e.g. at least 30 nm) over at least part of a main implantation surface of the semiconductor substrate.

Alternatively or optionally, the scattering oxide layer may be a layer having varying thicknesses or portions of different thicknesses. As the doping regions may spread more deeply into regions of the semiconductor substrate masked with thinner scattering oxide, and less deeply into regions of the semiconductor substrate masked with thicker scattering oxide, a graded doping profile may be obtained in the semiconductor substrate, for example.

The temperature of the semiconductor substrate 102 may be kept above 50° C. (or e.g. above 80° C., or e.g. above 120° C., or e.g. above 150° C., or e.g. above 200° C., or e.g. above 250° C.) for more than 70% of the implant process time used for implanting the predefined dose of doping ions to achieve the higher degree of activation of the doping ions.

More details and aspects are mentioned in connection with the embodiments described above or below. The embodiments shown in FIG. 5 may comprise one or more optional additional features corresponding to one or more aspects mentioned in connection with the proposed concept or one or more embodiments described above (e.g. FIGS. 1 to 4) or below.

Various examples relate to a method for generating highly doped impurity profiles in crystalline semiconductors, for example.

Aspects and features (e.g. the semiconductor device, the electrical device arrangement, the semiconductor substrate, the at least one device doping region, the implanting of the doping ions, the controlling of the temperature of the semiconductor substrate, the target temperature range, the main crystal direction, the main direction of the doping ion beam, the implantation energy, and the doping concentration) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
    a device doping region of an electrical device arrangement disposed in a semiconductor substrate,
    wherein a portion of the device doping region has a vertical dimension of more than 500 nm and a doping concentration of greater than $1*10^{15}$ dopant atoms per $cm^3$,
    wherein the doping concentration of the portion of the device doping region varies by less than 20% from a maximum doping concentration in the device doping region,
    wherein the semiconductor device comprises a plurality of device doping regions of the electrical device arrangement disposed in the semiconductor substrate,
    wherein a portion of each device doping region has a vertical dimension of more than 500 nm and a doping concentration of greater than $1*10^{15}$ dopant atoms per $cm^3$,
    wherein the doping concentration of the portion of each device doping region varies by less than 20% from a maximum doping concentration in the device doping region,
    wherein the plurality of device doping regions is formed adjacent to a backside of the semiconductor substrate.

2. The semiconductor device of claim 1, wherein the electrical device arrangement is a metal oxide semiconductor field effect transistor arrangement, an insulated gate bipolar transistor arrangement, a thyristor arrangement, or a diode arrangement.

3. The semiconductor device of claim 1, wherein the maximum doping concentration of each device doping region is larger than $1*10^{18}$ dopant atoms per $cm^3$.

4. The semiconductor device of claim 1, wherein the electrical device arrangement is a vertical transistor arrangement or a vertical diode arrangement, and wherein each device doping region is a field stop region, a drift region, a channel stopper region or a body region of the vertical transistor arrangement or the vertical diode arrangement.

5. The semiconductor device of claim 1, wherein the electrical device arrangement is a vertical diode arrangement, and wherein each device doping region is a cathode region or an anode region of the vertical diode arrangement.

6. The semiconductor device of claim 1, wherein the electrical device arrangement is a vertical transistor arrangement, and wherein each device doping region is a collector region, an emitter region, a source region or a drain region of the vertical transistor arrangement.

7. The semiconductor device of claim 1, wherein each device doping region is a graded field stop region, a graded emitter region or a graded n-type shorting region.

8. The semiconductor device of claim 1, wherein each device doping region has a graded doping profile.

9. The semiconductor device of claim 1, wherein the plurality of device doping regions is laterally surrounded by a cathode/anode region of a vertical diode arrangement or by a source/drain or collector/emitter region of a vertical transistor arrangement.

10. The semiconductor device of claim 1, wherein the electrical device arrangement is a compensation device arrangement, and wherein the plurality of device doping regions is a plurality of vertically extending compensation regions of the compensation device arrangement.

11. The semiconductor device of claim 1, wherein the electrical device arrangement is a compensation device arrangement, and wherein the plurality of device doping regions is a plurality of vertically extending drift regions of the compensation device arrangement.

12. The semiconductor device of claim 1, wherein the electrical device arrangement is a diode arrangement, and wherein each device doping region is a buried backside p-type island or n-type island of the diode arrangement.

13. The semiconductor device of claim 1, wherein the electrical device arrangement is a vertical diode arrangement or a vertical insulated gate bipolar transistor arrangement, and wherein each device doping region is a backside n-type emitter or p-type emitter of the vertical diode arrangement, or a backside p-type emitter of the vertical insulated gate bipolar transistor arrangement.

14. The semiconductor device of claim 1, wherein each device doping region is a junction termination extension structure or a variation of lateral doping structure.

15. The semiconductor device of claim 1, wherein each device doping region is a channel stopper region.

16. The semiconductor device of claim 1, wherein the doping concentration of the portion of each device doping region varies by less than 10% over at least 70% of the vertical extension.

17. The semiconductor device of claim 16, wherein each device doping region is a field-stop region, a backside emitter region, a junction termination region or a channel stopper region.

18. The semiconductor device of claim 1, wherein the doping concentration of the portion of each device doping region varies by less than 10% over at least 90% of the vertical extension.

19. A semiconductor device, comprising:
a device doping region of an electrical device arrangement disposed in a semiconductor substrate,
wherein a portion of the device doping region has a vertical dimension of more than 500 nm and a doping concentration of greater than $1*10^{15}$ dopant atoms per $cm^3$,
wherein the doping concentration of the portion of the device doping region varies by less than 20% from a maximum doping concentration in the device doping region,
wherein the electrical device arrangement is a vertical diode arrangement or a vertical insulated gate bipolar transistor arrangement,
wherein the device doping region is a backside or frontside n-type emitter or p-type emitter of the vertical diode arrangement, or a backside p-type emitter or n-type emitter of the vertical insulated gate bipolar transistor arrangement.

* * * * *